US012653336B2

(12) United States Patent
Zhang et al.

(10) Patent No.: US 12,653,336 B2
(45) Date of Patent: Jun. 16, 2026

(54) RADIOGRAPHIC INSPECTION DEVICE AND METHOD OF INSPECTING OBJECT

(71) Applicants: Tsinghua University, Beijing (CN); NUCTECH COMPANY LIMITED, Beijing (CN)

(72) Inventors: Li Zhang, Beijing (CN); Zhiqiang Chen, Beijing (CN); Qingping Huang, Beijing (CN); Jinning Liang, Beijing (CN); Mingzhi Hong, Beijing (CN); Yi Cheng, Beijing (CN); Minghua Qiu, Beijing (CN); Yao Zhang, Beijing (CN); Jianxue Yang, Beijing (CN); Lei Zheng, Beijing (CN)

(73) Assignees: Tsinghua University, Beijing (CN); NUCTECH COMPANY LIMITED, Beijing (CN)

( * ) Notice: Subject to any disclaimer, the term of this patent is extended or adjusted under 35 U.S.C. 154(b) by 326 days.

(21) Appl. No.: 18/284,026

(22) PCT Filed: Jan. 11, 2022

(86) PCT No.: PCT/CN2022/071215
§ 371 (c)(1),
(2) Date: Sep. 25, 2023

(87) PCT Pub. No.: WO2022/206102
PCT Pub. Date: Oct. 6, 2022

(65) Prior Publication Data
US 2024/0156293 A1      May 16, 2024

(30) Foreign Application Priority Data

Mar. 30, 2021    (CN) ........................ 202110344167.X

(51) Int. Cl.
*A47H 5/02* (2006.01)
*A47H 1/104* (2006.01)
*H05K 9/00* (2006.01)

(52) U.S. Cl.
CPC ............... *A47H 5/02* (2013.01); *A47H 1/104* (2013.01); *H05K 9/0018* (2013.01)

(58) Field of Classification Search
CPC . A47H 5/02; A47H 1/104; G01T 7/08; G01V 5/22; H05K 9/0018
See application file for complete search history.

(56) References Cited

U.S. PATENT DOCUMENTS 3,977,103 A * 8/1976 Strickland .............. A41H 15/00
38/108
5,069,148 A * 12/1991 Ishikawa .............. D05B 35/102
112/113
(Continued)

FOREIGN PATENT DOCUMENTS

CN        204200046 U      3/2015
CN        106062884 A      10/2016
(Continued)

OTHER PUBLICATIONS

International Search Report for PCT application No. PCT/CN2022/ 071215 dated Nov. 4, 2022 (6 pages including English Translation).
(Continued)

*Primary Examiner* — David J Makiya
*Assistant Examiner* — Miya Downing
(74) *Attorney, Agent, or Firm* — Merchant & Gould P.C.

(57) ABSTRACT

A radiographic inspection device and a method of inspecting an object are provided. The radiographic inspection device includes: a support frame, where an inspection space applicable to inspect an object is formed within the support frame, and the inspection space has an entrance and an exit
(Continued)

which are connecting to an outside; a transfer channel applicable to carry the object to move through the inspection space; a first shielding curtain and a second shielding curtain respectively mounted at the entrance and the exit; and a driving mechanism mounted on the support frame and configured to drive at least one of the first shielding curtain and the second shielding curtain to move, in response to the object getting close to or moving away from at least one of the entrance and the exit, so as to open or close the at least one of the entrance or the exit.

15 Claims, 15 Drawing Sheets

(56)      References Cited

U.S. PATENT DOCUMENTS

| | | | |
|---|---|---|---|
| 7,050,536 B1 * | 5/2006 | Fenkart | G01V 5/22 |
| | | | 378/68 |
| 10,210,960 B2 | 2/2019 | Splinter et al. | |
| 10,739,282 B2 | 8/2020 | Chen et al. | |
| 2016/0372223 A1 | 12/2016 | Splinter et al. | |
| 2019/0064082 A1 | 2/2019 | Chen et al. | |
| 2019/0113652 A1 * | 4/2019 | Allen | A61B 6/447 |

FOREIGN PATENT DOCUMENTS

| | | |
|---|---|---|
| CN | 106066337 A | 11/2016 |
| CN | 108447577 A | 8/2018 |
| CN | 110056212 A | 7/2019 |
| CN | 209360719 U | 9/2019 |
| CN | 209606628 U | 11/2019 |
| CN | 212781267 U | 3/2021 |
| JP | H11160487 A | 6/1999 |
| JP | 2006058234 A | 3/2006 |
| JP | 2018077091 A | 5/2018 |

OTHER PUBLICATIONS

Written Opinion of International Search Report for PCT Application No. PCT/CN2022/071215 mailed Nov. 4, 2022 (5 pages).
Office Action issued on Feb. 26, 2023 for Chinese application No. 202110344167.X (9 pages).

* cited by examiner

51'

3

522'

RADIOGRAPHIC INSPECTION DEVICE AND METHOD OF INSPECTING OBJECT

CROSS-REFERENCE TO RELATED APPLICATIONS

This application is a National Stage Application of International Application No. PCT/CN2022/071215, filed 11 Jan. 2022, which claims benefit of Ser. No. 202110344167.X, filed 30 Mar. 2021 in China, and which applications are incorporated herein by reference. To the extent appropriate, a claim of priority is made to each of the above disclosed applications.

TECHNICAL FIELD

Embodiments of the present disclosure relate to a radiographic inspection device, and in particular to a radiographic inspection device applicable to inspect an object carried on a transfer mechanism, and a method of inspecting an object using the radiographic inspection device.

BACKGROUND

In a field of non-invasive inspection of objects such as luggage or packages, an X-ray inspection device is often used to inspect objects for a presence of prohibited items such as drugs and explosives. The object to be inspected usually pass through an inspection space of the X-ray inspection device by means of a conveyor structure, and a radiographic emission apparatus emits X-rays into the inspection space to realize an inspection of the object. Generally, in existing radiographic inspection devices, shielding curtains, such as lead materials, are mounted at an entrance and an exit of the inspection space, so as to shield the X-rays inside the radiographic inspection device, thereby preventing X-rays from leaking.

Shielding curtains in current practical applications are all distributed fixed suspensions. To ensure an effectiveness of shielding X-rays, a low end of the shielding curtain is in contact with a conveyor belt moving in a transfer mechanism. During an inspection process, an object to be inspected enters an inspection region of the inspection space through a power of the conveyor belt to push open the shielding curtain at the entrance. After the inspection is completed and the object passes through the inspection space, it is required to push open the shielding curtain at the exit again through a dragging of the conveyor belt to move away from the inspection space, so that the object moves away from the radiographic inspection device.

In the existing radiographic inspection device, the shielding curtain mounted at the exit and the shielding curtain mounted at the entrance are fixed on a support frame of the radiographic inspection device. Due to a relatively heavy nature of the shielding curtain, it is impossible to push open the shielding curtain to enter the inspection region for a lighter-weight object to be inspected. On the contrary, when the shielding curtain is pushed open by the object too early, a leaking of X-ray may be inevitably caused.

In another type of radiographic inspection device, multiple shielding curtains are distributed in the inspection space. In this way, no matter at the entrance or the exit, when one shielding curtain is pushed open, other shielding curtains are remained closed, thereby ensuring to prevent X-rays from leaking. However, in this type of radiographic inspection device, it is required to have a certain length of inspection space to meet requirements of shielding X-rays, so that a longer inspection space is required and a larger space is occupied.

SUMMARY

The purpose of the present disclosure is to solve at least one aspect of the above problems and defects in the existing technologies.

According to an embodiment of an aspect of the present disclosure, a radiographic inspection device is provided, including a support frame, where an inspection space applicable to inspect an object is formed within the support frame, and the inspection space has an entrance and an exit which are connecting to an outside; a transfer channel applicable to carry the object to move through the inspection space; a first shielding curtain and a second shielding curtain respectively mounted at the entrance and the exit; and a driving mechanism mounted on the support frame and configured to drive at least one of the first shielding curtain and the second shielding curtain to move, in response to the object getting close to or moving away from at least one of the entrance and the exit, so as to open or close at least one of the entrance or the exit.

According to an embodiment of the present disclosure, the radiographic inspection device further includes a first detection apparatus, where the driving mechanism drives the first shielding curtain to rise, in response to the first detection apparatus detecting that the object carried on the transfer channel is located on an outer side of the support frame and is getting close to the first shielding curtain, so as to allow the object on the transfer channel to move into the inspection space.

According to an embodiment of the present disclosure, the radiographic inspection device further includes a second detection apparatus, where the driving mechanism drives the first shielding curtain to fall to an initial position, in response to the second detection apparatus detecting that the object carried on the transfer channel moves in the support frame away from the first shielding curtain.

According to an embodiment of the present disclosure, the radiographic inspection device further includes a third detection apparatus, where the driving mechanism drives the second shielding curtain to rise, in response to the third detection apparatus detecting that the object carried on the transfer mechanism is located in the support frame and is getting close to the second shielding curtain, so as to allow the object on the transfer mechanism to move outside the inspection space.

According to an embodiment of the present disclosure, the radiographic inspection device further includes a fourth detection apparatus, where the driving mechanism drives the second shielding curtain to fall to an initial position, in response to the fourth detection apparatus detecting that the object carried on the transfer mechanism moves outside the support frame away from the second shielding curtain.

According to an embodiment of the present disclosure, the first detection apparatus, the second detection apparatus, the third detection apparatus and the fourth detection apparatus include: light emitting components and light receiving components respectively mounted on two sides of the support frame and perpendicular to a movement direction of the object, and the light receiving components are applicable to receive lights emitted by the light emitting components.

According to an embodiment of the present disclosure, the driving mechanism includes a first driving mechanism and a second driving mechanism applicable to respectively drive the first shielding curtain and the second shielding curtain to rise or fall.

According to an embodiment of the present disclosure, each of the first driving mechanism and the second driving mechanism includes a driver mounted on the support frame; and a transmission mechanism, where the driver drives the shielding curtain to rise or fall through the transmission mechanism.

According to an embodiment of the present disclosure, the driver includes a motor. The transmission mechanism includes a driven shaft mounted on an upper part of the support frame and driven to rotate by the motor; two first rollers respectively mounted near two ends of the driven shaft and configured to rotate with the driven shaft; two second rollers respectively mounted on two opposite upright frames of the support frame, and respectively located below the two first rollers; two conveyor belts each wrapped around one of the two first rollers and one of the two second rollers, and a joint portion, where two ends of the joint portion are respectively connected to the two conveyor belts, and the shielding curtain is connected to the joint portion, so that the shielding curtain is driven to move up and down with the conveyor belt.

According to an embodiment of the present disclosure, the joint portion includes a main body portion having a shape of strip, where an upper end of the shielding curtain is connected to the main body portion; and two guide mechanisms respectively disposed at two ends of the main body portion, where each guide mechanism is applicable to fit with the upright frame to guide the joint portion to move up and down along the upright frame.

According to an embodiment of the present disclosure, each guide mechanism includes a first pulley apparatus disposed at two ends of the main body portion and extending into a guide groove formed in the upright frame, so as to rotate by abutting against a side wall of the guide groove, where the guide groove extends in an upright direction on the upright frame.

According to an embodiment of the present disclosure, each guide mechanism includes a sliding block disposed at two ends of the main body portion and slidably extending into a guide groove formed in the upright frame, where the guide groove extends in an upright direction on the upright frame.

According to an embodiment of the present disclosure, the guide structure further includes a second pulley apparatus mounted on a lower side of two ends of the main body portion, where pulleys of the second pulley apparatus are rotatably in contact with a bottom of the guide groove.

According to an embodiment of the present disclosure, the transmission mechanism further includes a counterweight, where the counterweight is connected between the two conveyor belts, so as to balance a weight of the joint portion and a weight of the shielding curtain.

According to an embodiment of the present disclosure, the radiographic inspection device further includes a limiting apparatus, where the limiting apparatus is applicable to limit a range of movement of the joint portion in an upright direction.

According to an embodiment of the present disclosure, the limiting apparatus includes: a first proximity switch mounted on the support frame; and a matching switch mounted on the joint portion, where the driving mechanism stops driving the shielding curtain to rise in response to the matching switch being close to the first proximity switch.

According to an embodiment of the present disclosure, the limiting apparatus includes a second proximity switch mounted on the support frame, where the driving mechanism stops driving the shielding curtain to fall in response to the matching switch being close to the second proximity switch.

According to an embodiment of the present disclosure, the driver includes a motor. The transmission mechanism includes a first roller mounted on an upper part of the support frame and driven to rotate by the motor; a second roller mounted on the support frame and located below the first roller; a conveyor belt wrapped around the first roller and the second roller; and a joint portion, where the shielding curtain is connected to the conveyor belt through the joint portion, so that the shielding curtain is driven to move up and down with the conveyor belt.

According to an embodiment of the present disclosure, the joint portion includes: a main body portion connected to the conveyor belt; a pair of clamping elements, where the pair of clamping elements grip an upper end of the shielding curtain and are connected to the main body portion.

According to an embodiment of the present disclosure, the transmission mechanism further includes a first guide structure, where the first guide structure is applicable to guide the joint portion to move up and down.

According to an embodiment of the present disclosure, the first guide structure includes: a guide rail mounted on the support frame; and a guide block mounted on the joint portion.

According to an embodiment of the present disclosure, the transmission mechanism further includes a counterweight, where the counterweight is connected to the other side of the conveyor belt opposite to one side connecting to the joint portion, so as to balance a weight of the joint portion and a weight of the shielding curtain.

According to an embodiment of the present disclosure, the transmission mechanism further includes a second guide structure, where the second guide structure is applicable to guide the counterweight to move up and down.

According to an embodiment of the present disclosure, the transmission mechanism further includes a limiting apparatus, where the limiting apparatus is applicable to limit a range of movement of the joint portion in an up and down direction.

According to an embodiment of the present disclosure, the limiting apparatus includes: a first proximity switch mounted on the support frame; and a matching switch mounted on the joint portion, where the driving mechanism stops driving the shielding curtain to rise in response to the matching switch being close to the first proximity switch.

According to an embodiment of the present disclosure, the limiting apparatus further includes a second proximity switch mounted on the support frame, where the driving mechanism stops driving the shielding curtain to fall in response to the matching switch being close to the second proximity switch.

According to an embodiment of another aspect of the present disclosure, a method of inspecting an object using the aforementioned radiographic inspection device includes:

placing the object to be inspected on a transfer mechanism;

driving, when the object to be inspected moves close to the entrance, the first shielding curtain to rise by the driving mechanism, so as to allow the object on the transmission mechanism to move into the inspection space;

driving, when the object on the transmission mechanism moves in the support frame away from the first shielding curtain, the first shielding curtain to fall to an initial position by the driving mechanism;

performing a radioactive inspection on the object moving within the inspection space; and driving, when the inspected object in the inspection space moves close to the exit, the second shielding curtain to rise by the driving mechanism, so as to allow the object to move outside the inspection space.

According to an embodiment of the present disclosure, the method further includes steps of: driving, when the object outside the support frame moves away from the second shielding curtain, the second shielding curtain to fall to the initial position by the driving mechanism.

DETAILED DESCRIPTION OF EMBODIMENTS

Figure 1:
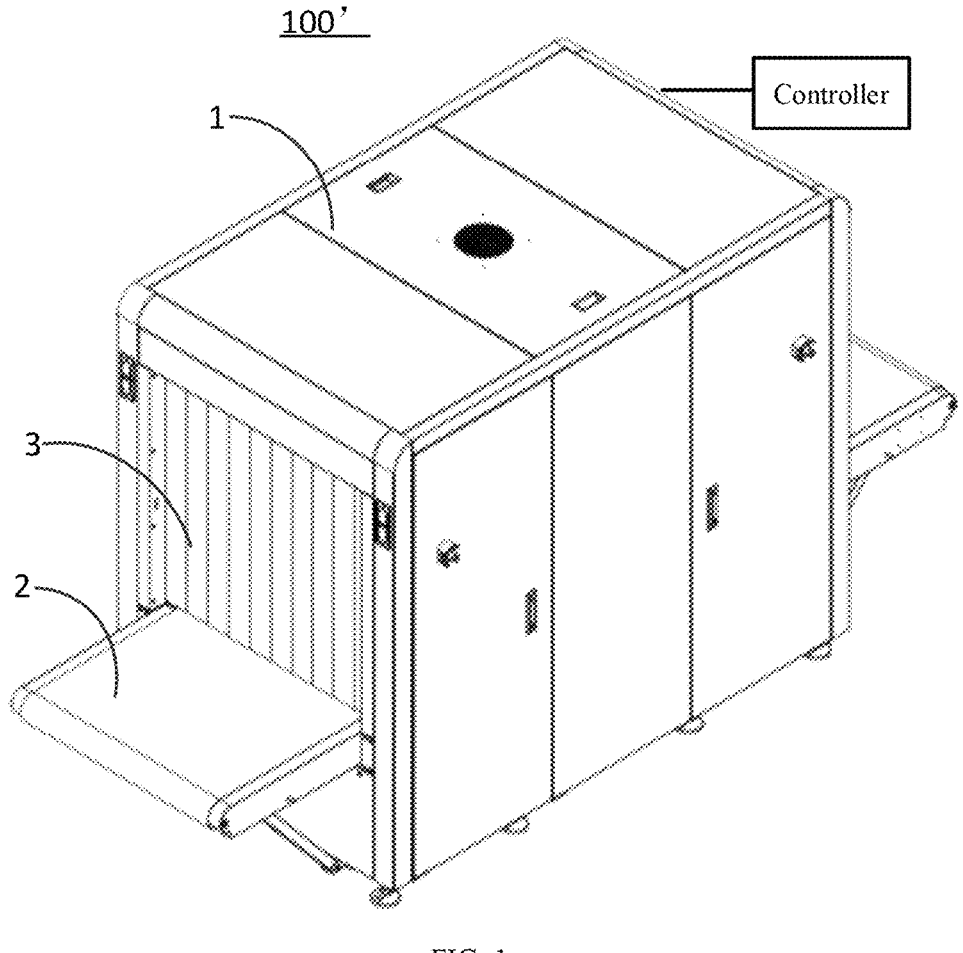
FIG. 1 shows a three-dimensional schematic diagram of a radiographic inspection device of an exemplary embodiment of the present disclosure.

With reference to accompanying drawings in embodiments of the present disclosure, the technical solution in the embodiments of the present disclosure will be described clearly and completely. Apparently, the embodiments described are only some embodiments of the present disclosure, rather than all embodiments. The description of at least one exemplary embodiment below is actually only explanatory, and it will never be used as any limitation on the present disclosure and its application or use. Based on embodiments in the present disclosure, all other embodiments derived by those of ordinary skill in the art without creative labor, fall within the scope of protection of the present disclosure.

In the following detailed descriptions, for purposes of explanation, many specific details are elaborated to provide a comprehensive understanding of embodiments of the present disclosure. However, it is clear that one or more embodiments may be implemented without these specific details. In other cases, well-known structures and devices are illustrated to simplify the accompanying drawings. It may not be discussed in details about technologies, methods and devices known by those of ordinary skill in the art in related fields, but in an appropriate case, the technologies, methods and devices should be regarded as a part of granted description.

In the description of the present disclosure, it should be understood that an orientation or position relationship indicated by words such as "front, back, up, down, left, right", "lateral, longitudinal, vertical, horizontal" and "top, bottom" and other positions, is just to facilitate the description of the present disclosure and simplify the description, based on the orientation or position relationship shown in the figures. Without an opposite explanation, these orientation words do not indicate and suggest devices or components referred to that must have a specific orientation or construction or operate in a specific orientation, so it should not be understood as a limitation on the scope of protection of the present disclosure. The orientation word "inner or outside" refers to an inside or an outside of a contour of each component itself.

In the description of the present disclosure, it should be understood that it is just to facilitate differences in corresponding parts, by using words "first" and "second" to define parts. If there is no other statements, the above words have no special meaning, which should not be understood as a limitation on the scope of protection of the present disclosure.

According to a general concept of an invention of the present disclosure, a radiographic inspection device is provided, including a support frame, where an inspection space applicable to inspect an object is formed within the support frame, and the inspection space has an entrance and an exit connecting to an outside; a transfer channel applicable to carry the object to move through the inspection space; a first shielding curtain and a second shielding curtain respectively mounted at the entrance and the exit; and a driving mechanism mounted on the support frame and configured to drive at least one of the first shielding curtain and the second shielding curtain to move, in response to the object getting close to or moving away from at least one of the entrance and the exit, so as to open or close at least one of the entrance or the exit.

Figure 2:
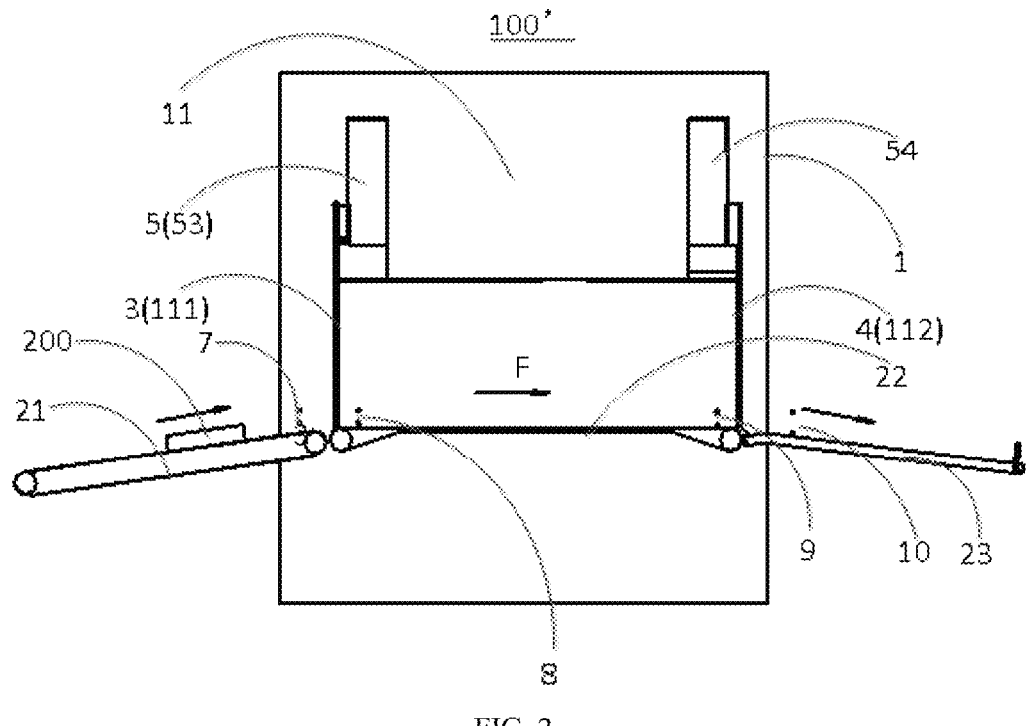
FIG. 2 shows a simplified schematic diagram of a process of inspecting an object by the radiographic inspection device shown in FIG. 1.

FIG. 1 shows a three-dimensional schematic diagram of a radiographic inspection device of an exemplary embodiment of the present disclosure; FIG. 2 shows a simplified schematic diagram of a process of inspecting an object by the radiographic inspection device shown in FIG. 1.

In an exemplary embodiment, with reference to FIGS. 1 to 2, the radiographic inspection device 100 is applicable to inspect whether a prohibited item such as a drug or an explosive exists in an object 200 (such as suitcases, packages, and handbags) or not, at places with high turnover of rate such as stations, airports, stadiums or shopping malls. The radiographic inspection device 100 includes: a support frame 1, a transfer mechanism 2, a first shielding curtain 3, a second shielding curtain 4, and a driving mechanism 5. An inspection space 11 applicable to inspect the object 200 is formed within the support frame 1. The inspection space 11 has an entrance 111 and an exit 112 connecting to an outside. The support frame 1 is equipped with a housing made of shielding material to prevent radiation from leaking. The transfer mechanism 2 is applicable to carry the object 200 to move through the inspection space 11. An X-ray emitting and receiving apparatus such as a CT machine is mounted on the support frame to perform X-ray scanning on the object 200 transferred from transfer mechanism 2 to the inspection space 11. The first shielding curtain 3 and the second shielding curtain 4 are respectively mounted at the entrance 111 and the exit 112 of the inspection space 11. The driving mechanism 5 is mounted on the support frame 1, for example on a top frame 14 of the support frame 1, and is configured to drive at least one of the first shielding curtain 3 and the second shielding curtain 4 to move, in response to the object getting close to or moving away from at least one of the entrance 111 and the exit 112, so as to open or close at least one of the entrance 3 or the exit 4. The radiographic inspection device 100 also includes a controller applicable to receive electrical signals from various sensors and control operations of related devices (such as CT machines, driving mechanisms, etc.) of the radiographic inspection device.

The support frame 1 may include a plurality of upright frames 13 located on two sides of the support frame 1 and a plurality of top frames 14 located on an upper part of the upright frame 13. The upright frame 13 is mounted on the base 15, and the transfer mechanism 2 includes an input transfer mechanism 21 mounted outside the entrance 111 of the mounting frame 1, an internal transfer mechanism 22 located in the inspection space 11, and an output transfer mechanism 23 mounted outside the exit 112 of the mounting frame 1. Each of the input transfer mechanism 21, the internal transfer mechanism 22, and the output transfer mechanism 23 may include a tape machine for cyclic rotation. The object 200 to be inspected is placed on the input transfer mechanism 21 and transferred from the input transfer mechanism 21 through the entrance 111 to the internal transfer mechanism 22. After being inspected in the inspection space 11, the object is transported from the internal transfer mechanism 22 through the exit 112 to the output transfer mechanism 23, to complete a process of scanning the object 200. That is to say, the object 200 in the transfer mechanism 2 enters the inspection space 11 through the entrance 111, and moves from the exit 112 on the transfer mechanism 2 to an outside of the inspection space 11 after being scanned.

In this way, in the radiographic inspection device of the embodiments of the present disclosure, before the object 200 to be inspected passes the entrance 111, according to the object 200 getting close to the entrance 111, the first shielding curtain 3 may be lifted by the driving mechanism 5, so as to allow the object 200 to smoothly pass through the entrance 111. After the object passes through the entrance 111, according to the object moving away from the entrance 111, the driving mechanism 5 will drive the first shielding curtain 3 to fall. After completing the scanning of the object in the inspection space 11, according to the object 200 being close to the exit 112, the second shielding curtain 4 may be lifted by the driving mechanism 5, so as allow the object 200 to smoothly pass through the exit 112. After the object passes through the exit 112, according to the object moving away from the exit 112, the driving mechanism 5 will drive the second shielding curtain 3 to fall, so as to prevent X-rays in the inspection space from leaking outside, which causes radiation pollution to surrounding environments.

In an exemplary embodiment, with reference to FIGS. 1 to 2, the radiographic inspection device 100 also includes a first detection apparatus 7. The driving mechanism 5 drives the first shielding curtain 3 to rise, in response to the first detection apparatus 7 detecting that the object 200 carried on the input transfer mechanism 21 of the transfer mechanism 2 is located on an outer side of the support frame 1 and is getting close to the first shielding curtain 3 located at the entrance in a movement direction F. The first shielding curtain is in an open state, so as to allow the object 200 on the transfer mechanism 2 to move into an interior of the inspection space 11.

In an exemplary embodiment, with reference to FIGS. 1 to 2, the radiographic inspection device 100 also includes a second detection apparatus 8. The driving mechanism 5 drives the first shielding curtain 3 to fall to an initial position, in response to the second detection apparatus 8 detecting that the object 200 carried on the internal transfer mechanism 22 of the transfer mechanism 2 moves in the support frame 1 away from the first shielding curtain 3 located at the entrance 111. The first shielding curtain is in a closed state, so as to prevent radiation from leaking.

In an exemplary embodiment, with reference to FIGS. 1 to 2, the radiographic inspection device 100 also includes a third detection apparatus 9. The driving mechanism 5 drives the second shielding curtain 4 to rise, in response to the third detection apparatus 9 detecting that the object carried on the transfer mechanism 2 is located in the support frame 1 and is getting close to the second shielding curtain 4, so as to allow the object on the transfer mechanism 2 to move outside the inspection space 11.

In an exemplary embodiment, with reference to FIGS. 1 to 2, the radiographic inspection device 100 also includes a fourth detection apparatus 10. The driving mechanism 5 drives the second shielding curtain 4 to fall to an initial position, in response to the fourth detection apparatus 10 detecting that the object carried on the transfer mechanism 2 moves outside the support frame 1 away from the second shielding curtain 4.

It may be understood that the first detection apparatus 7, the second detection apparatus 8, the third detection apparatus 9, and the fourth detection apparatus 10 respectively detect that the object 200 reaches different predetermined positions, that is, a position where the object is getting close to the entrance 111, a position where the object is getting away from the entrance 111, a position where the object is getting close to the exit 112, and a position where the object is getting away from the exit 112.

In an exemplary embodiment, each of the first detection apparatus 7, the second detection apparatus 8, the third detection apparatus 9 and the fourth detection apparatus 10 includes: light emitting components and light receiving components mounted on two sides of the support frame 1 perpendicular to a movement direction F of the object 200, and the light receiving components are applicable to receive lights emitted by the light emitting devices. When the object 200 moves to block beams emitted by the light emitting components, the beams received by the light receiving components decrease or even no beam reaches the light receiving components, thereby detecting that the object 200 moves to a predetermined position. The controller controls the driving mechanism to drive the first shielding curtain or the second shielding curtain to rise, fall, or maintain in an original state based on electrical signals generated by optical receiving components indicating that the object has reached the predetermined position.

Figure 3:
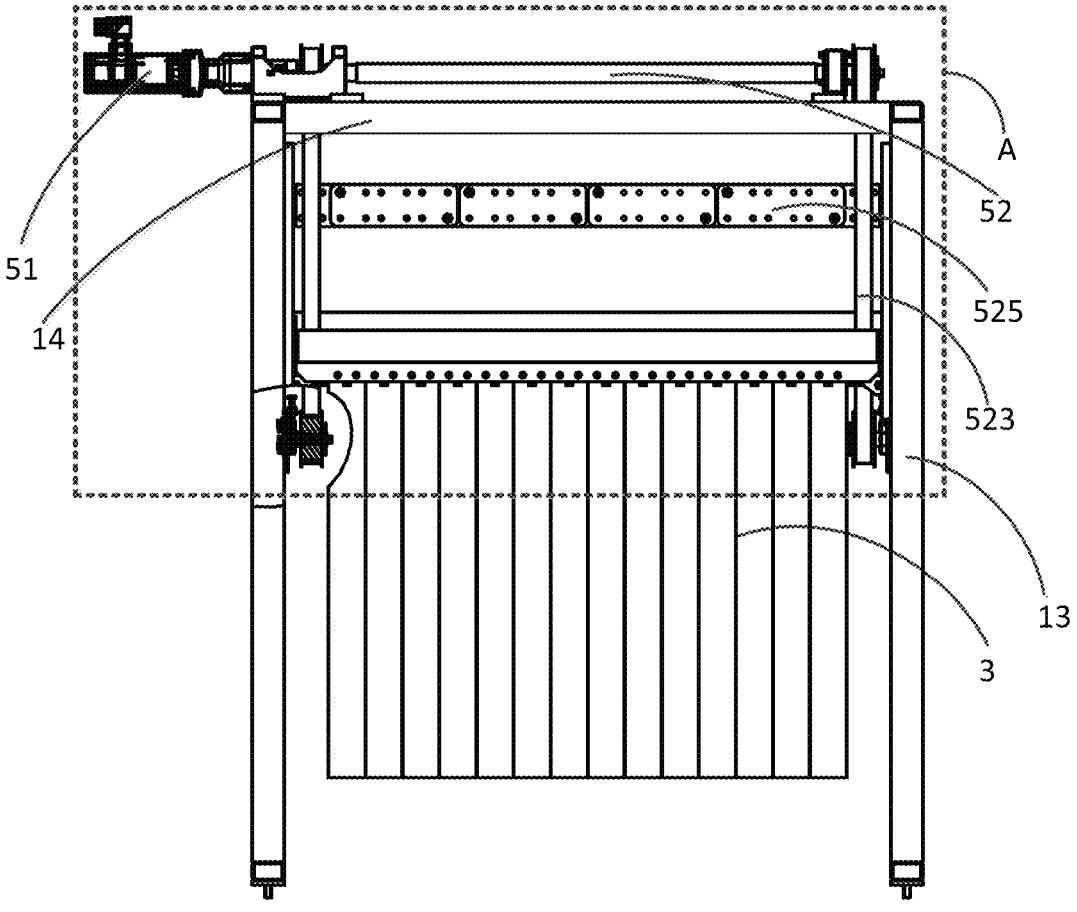
FIG. 3 shows a partial elevation view of the radiographic inspection device shown in FIG. 1.
Figures 4, 5:
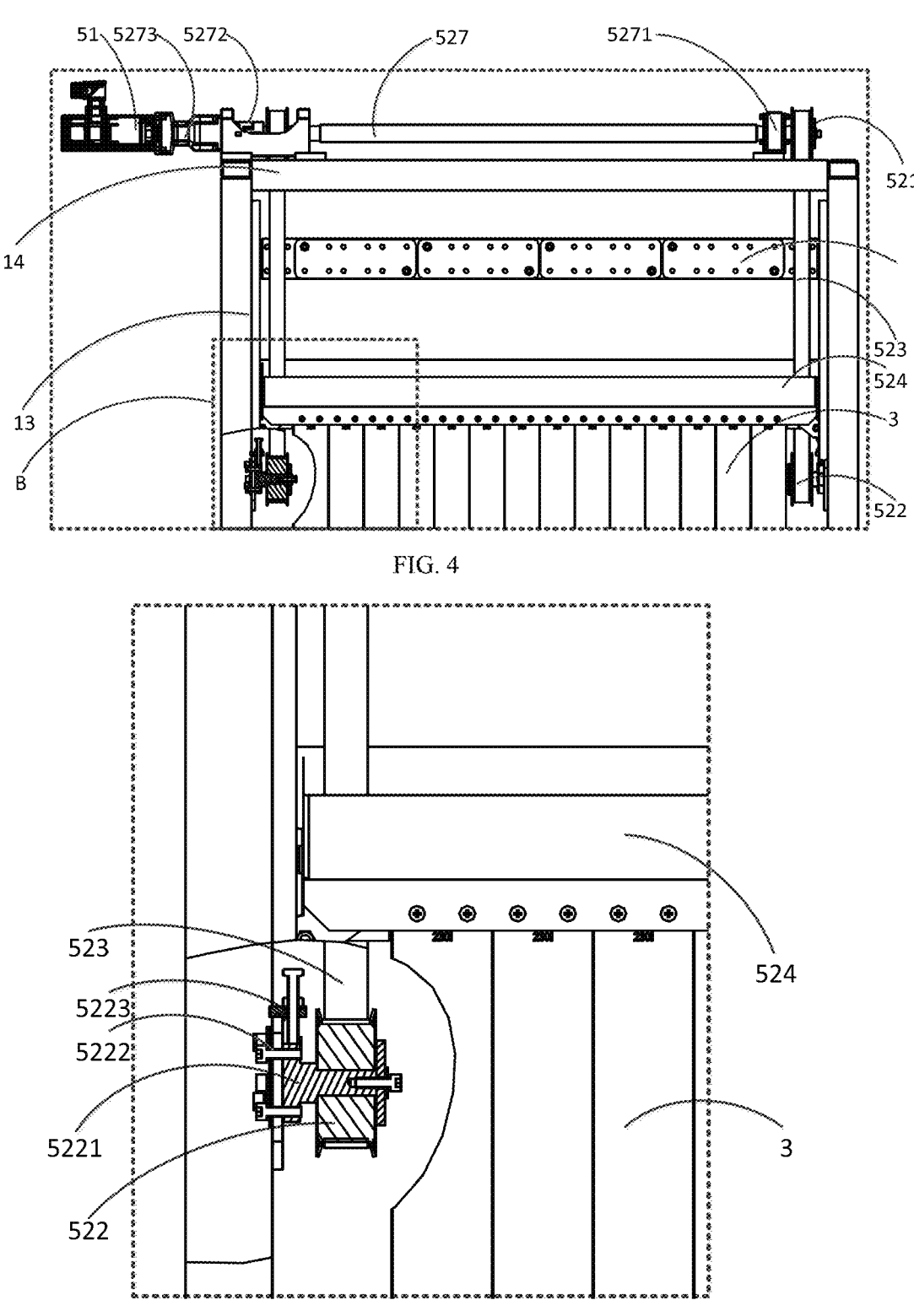
FIG. 4 shows an enlarged schematic diagram of part A shown in FIG. 3.
FIG. 5 shows an enlarged schematic diagram of part B shown in FIG. 4.
Figure 6:
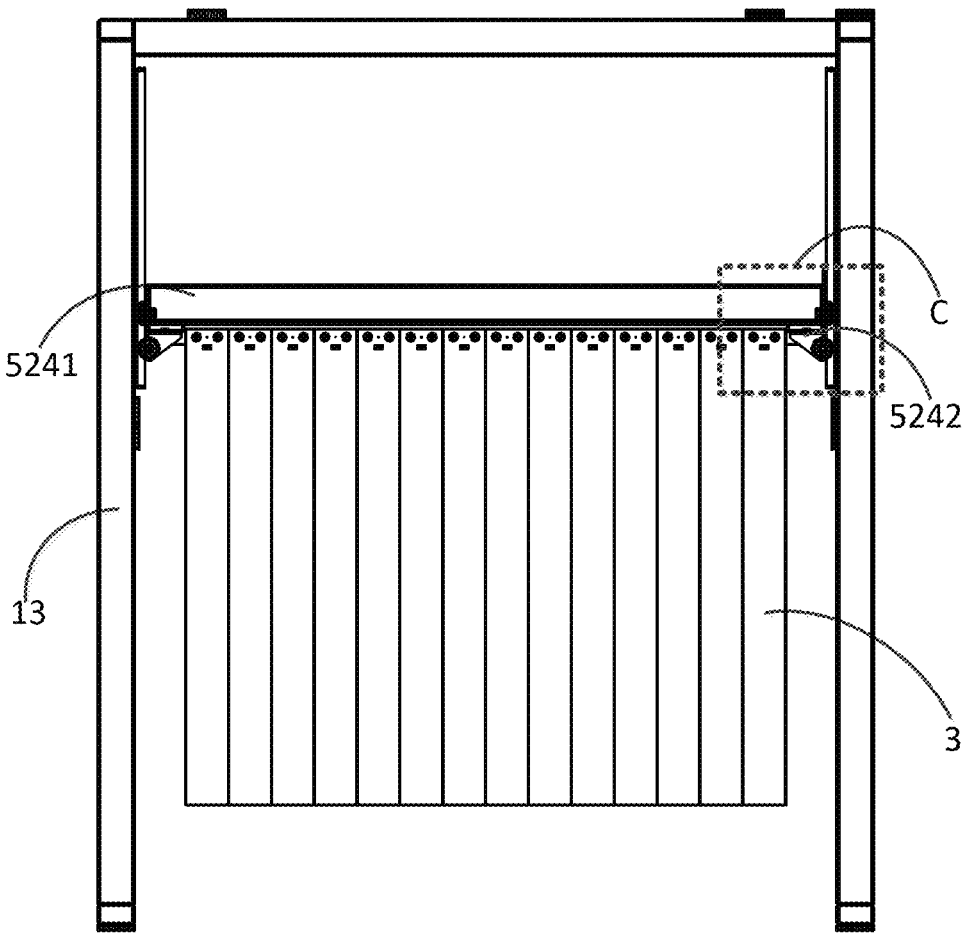
FIG. 6 shows another partial elevation view of the radiographic inspection device shown in FIG. 1.
Figure 7:
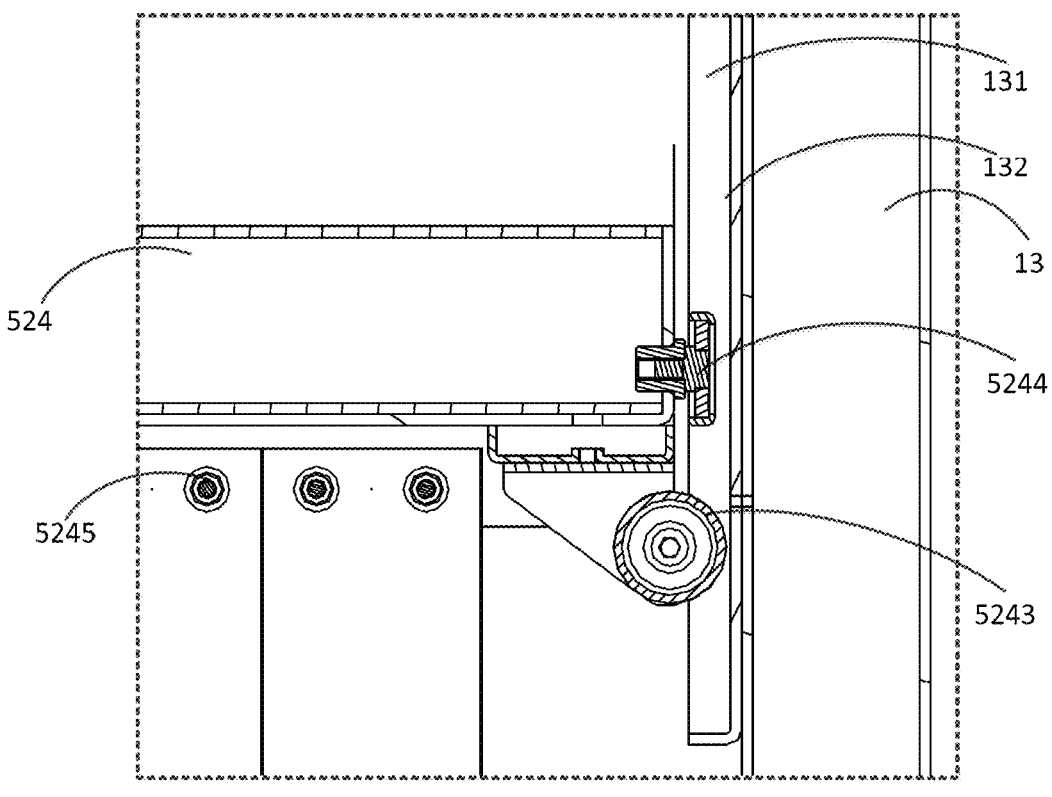
FIG. 7 shows an enlarged schematic diagram of part C shown in FIG. 6.
Figure 8:
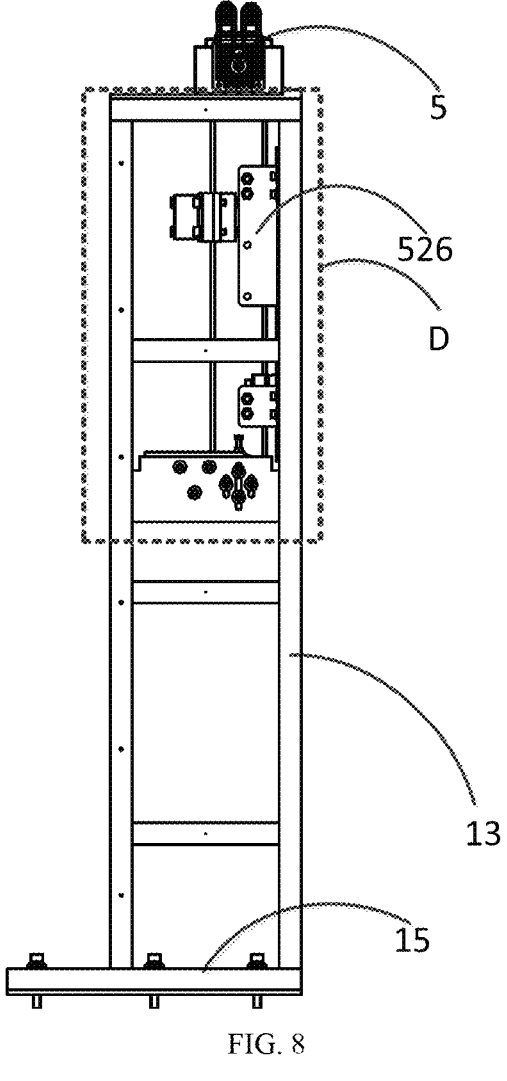
FIG. 8 shows a partial side view of the radiographic inspection device shown in FIG. 1.
Figure 9:
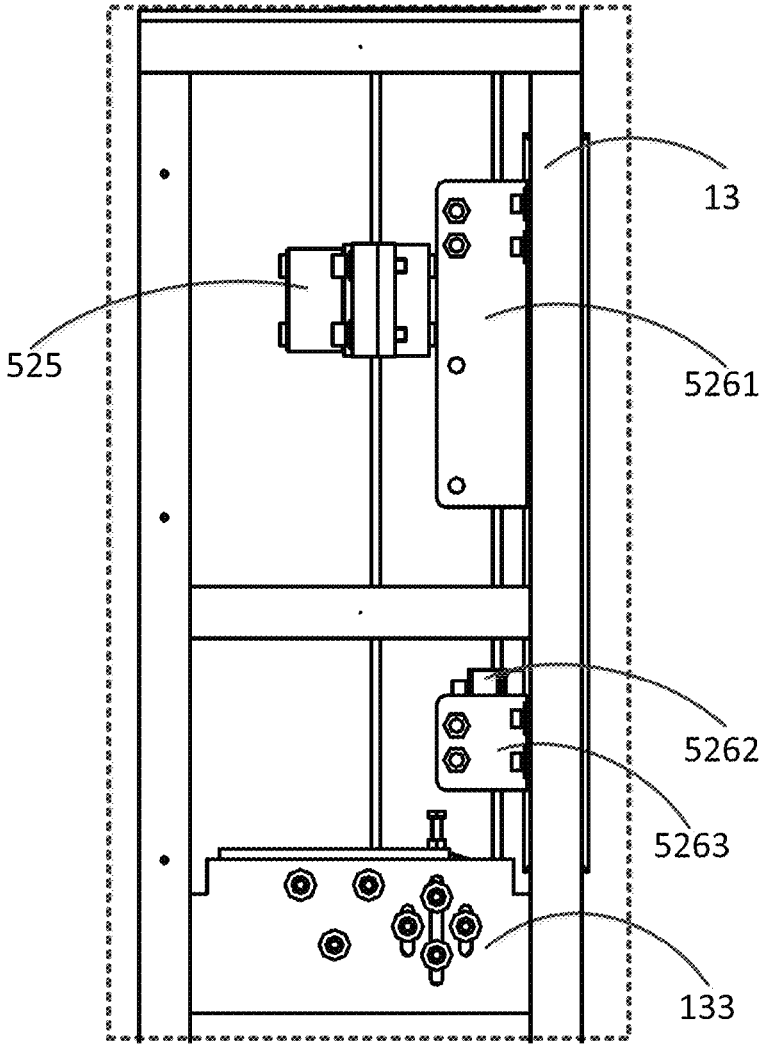
FIG. 9 shows an enlarged schematic diagram of part D shown in FIG. 8.
Figures 10, 11:
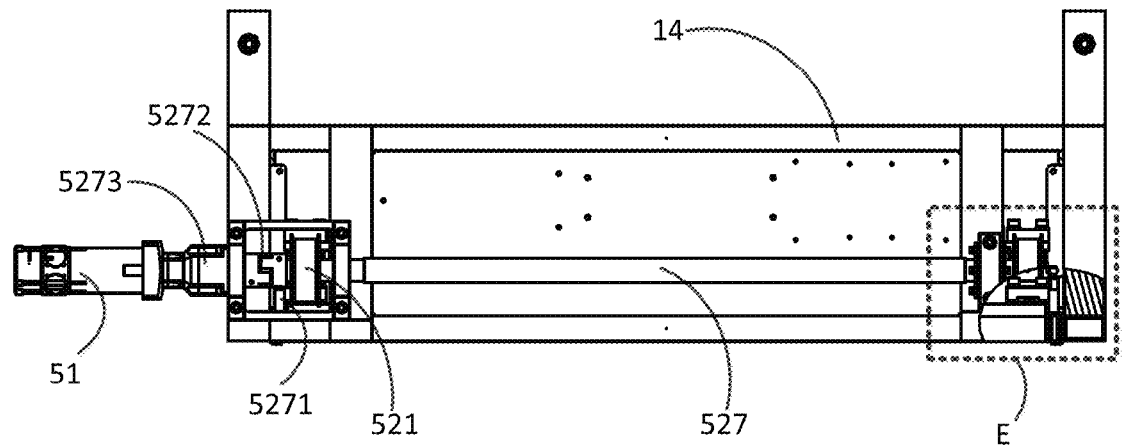
FIG. 10 shows a partial top view of the radiographic inspection device shown in FIG. 1.
FIG. 11 shows an enlarged schematic diagram of part E shown in FIG. 10.

FIG. 3 shows a partial elevation view of the radiographic inspection device shown in FIG. 1. FIG. 4 shows an enlarged schematic diagram of part A shown in FIG. 3. FIG. 5 shows an enlarged schematic diagram of part B shown in FIG. 4. FIG. 6 shows another partial elevation view of the radiographic inspection device shown in FIG. 1. FIG. 7 an enlarged schematic diagram of part C shown in FIG. 6. FIG. 8 shows a partial side view of the radiographic inspection device shown in FIG. 1. FIG. 9 shows an enlarged schematic diagram of part D shown in FIG. 8. FIG. 10 shows a partial top view of the radiographic inspection device shown in FIG. 1. FIG. 11 shows an enlarged schematic diagram of part E shown in FIG. 10.

In an exemplary embodiment, with reference to FIG. 2, the driving mechanism 5 includes a first driving mechanism and a second driving mechanism applicable to respectively drive the first shielding curtain 3 and the second shielding curtain 4 to rise or fall.

In an exemplary embodiment, with reference to FIGS. 3 to 11, each of the first driving mechanism and the second driving mechanism may include: a driver 51 mounted on the support frame 1; and a transmission mechanism 52, where the driver 51 drives the shielding curtain 3 to rise or fall through the transmission mechanism 52, so as to open or close the entrance 111.

In an exemplary embodiment, with reference to FIGS. 3 to 11, the driver 51 includes a motor applicable to drive the transmission mechanism 52. The transmission mechanism includes a driven shaft 527, two first rollers 521, two second rollers 522, conveyor belts 523, and a joint portion 524. The driven shaft 527 is disposed on an upper part of the top frame 14 of the support frame 1, and is driven to rotate by the motor through a reduction mechanism 5273 and a coupling 5272. The two first rollers 521 are respectively mounted near two ends of the driven shaft 527, so as to rotate with the driven shaft 527. Each first roller is mounted on the upper part of the top frame 14 of the support frame 1 through a bearing mechanism 5271. Two second rollers 522 are respectively mounted on the upright frame 13 of the support frame 1 and respectively located below the two first rollers 521. Two conveyor belts 523 are each wrapped around one of the two first rollers 521 and one of the two second rollers 522, so as to form two groups of conveyor belt mechanisms. Two ends of the joint portion 524 are respectively connected to the two conveyor belts 523, and the shielding curtain 3 is connected to the joint portion 524, so that the shielding curtain 3 is driven to move up and down with the conveyor belt 523.

In an exemplary embodiment, with reference to FIGS. 4 to 5 and 8 to 9, each second roller 522 is rotatably mounted on a fixed shaft 5221, which is mounted on a support base 133 located between the upright frames 13 using connecting components 5222 such as bolts. A height of the fixed shaft 5221 relative to the upright frame 13 may be adjusted by an adjusting bolt 5223, so as to adjust a tension of the conveyor belt.

In an exemplary embodiment, with reference to FIGS. 3 to 11, the joint portion 524 includes a main body portion 5241 having a shape of strip and two guide mechanisms 5242. The upper end of the shielding curtain 3 is connected to the main body portion 5241 through a plurality of connecting components 5245 such as bolts. The two guide mechanisms 5242 are respectively disposed at two ends of the main body portion 5241. Each guide mechanism 5242 is applicable to fit with the upright frame 13 to guide the main body portion 5241 to move up and down along the upright frame 13. In this way, the driver 51 drives two first rollers 521 to rotate through the driven shaft 527, so as to further drive the conveyor belt 523 to move up and down, thereby driving the upper end of the shielding curtain 3 and the entire shielding curtain 3 to move up and down.

Although an embodiment of the transmission mechanism including the first rollers, the second rollers and the conveyor belts are described above, the present disclosure is not limited to this. In an alternative embodiment, the transmission mechanism may include a turbine driven by a motor and a worm which matches with the turbine. The joint portion is mounted on the worm. In this way, the motor drives the turbine to rotate, and through a meshing between the turbine and the worm, a rotation of the motor is converted into a linear movement of the worm, thereby causing the worm to drive the shielding curtain to rise and fall. In another alternative embodiment, a piston rod of a pneumatic cylinder or a hydraulic cylinder may be used to drive the joint portion to reciprocate straight up and down, thereby driving the shielding curtain to rise and fall.

In an exemplary embodiment, each guide mechanism 5242 includes a first pulley apparatus 5244. The first pulley apparatus 5244 is disposed at two ends of the main body portion 5241 and extends into a guide groove 131 formed in the upright frame 13, so as to rotate by abutting against a side wall of the guide groove 131. The guide groove 131 extends in an upright direction on the upright frame 13. In this way, the shielding curtain 3 may be prevented from swinging back and forth.

In an alternative exemplary embodiment, each guide mechanism includes a sliding block. The sliding block is disposed at two ends of the main body portion 5241 and slidably extending into a guide groove 131 formed in the upright frame 13. The guide groove extends in an upright direction on the upright frame.

In an exemplary embodiment, with reference to FIGS. 3 to 11, the guide structure 5242 also includes a second pulley apparatus 5243. The second pulley apparatus 5243 is mounted on a lower side of two ends of the main body portion 5241. Pulleys of the second pulley apparatus 5243 are rotatably in elastic contact with a bottom 132 of the guide groove 131. In this way, the shielding curtain 3 may be prevented from swinging left and right, and the shielding curtain 3 may be maintain to move up and down in a stable posture.

In an exemplary embodiment, the transmission mechanism 52 also includes a counterweight 525. A weight of the counterweight 525 depends on a total weight of the joint portion 524 and the shielding curtain 3. The counterweight 525 is connected between the two conveyor belts 523 and located on the other side opposite to one side connecting to the joint portion 524, so as to balance a weight of the joint portion 524 and a weight of the shielding curtain 3. By disposing the counterweight 525, a force driving a movement of the shielding curtain may be reduced, thereby reducing a power of the driver.

In an exemplary embodiment, with reference to FIGS. 3 to 8, the radiographic inspection device 100 also includes a limiting device 526. The limiting apparatus 526 is applicable to limit a range of movement of the joint portion 524 in an up and down direction, thereby limiting a lifting range of the shielding curtain 3. Specifically, the limiting apparatus 526 includes a first proximity switch 5261 mounted on the upright frame 13 of the support frame 1; and a matching switch 5262 mounted on the joint portion 524. The driving mechanism 5 stops driving the shielding curtain 3 to rise in response to the matching switch 5262 being close to the first proximity switch 5261. Furthermore, the limiting apparatus

526 also includes a second proximity switch 5263 mounted on the upright frame 13 of the support frame 1 and located below the first proximity switch 5261. The driving mechanism 5 stops driving the shielding curtain 3 to fall in response to the matching switch 5262 being close to the second proximity switch 5263. That is to say, when the matching switch 5262 is close to the first proximity switch 5261, the shielding curtain 3 is stopped rising. When the matching switch 5262 is close to the second proximity switch 5263, the shielding curtain 3 is stopped falling. In this way, the range of movement of the upper end of shielding curtain 3 is limited to a distance between the first proximity switch 5261 and the second proximity switch 5263. That is to say, a maximum lifting range of shielding curtain 3 is the distance between the first proximity switch 5261 and the second proximity switch 5263. In an exemplary embodiment, the first proximity switch 5261 and the second proximity switch 5263 are electromagnetically coupled with the matching switch 5262 through an inductive induction. For example, each of the first proximity switch 5261 and the second proximity switch 5263 includes a transmitting coil. The matching switch 5262 includes a receiving coil electromagnetically coupled with the transmitting coil. In an alternative embodiment, the first proximity switch 5261 and the second proximity switch 5263 are electrically connected to the matching switch 5262 through an electrical contact manner.

In an exemplary embodiment, the first shielding curtain 3 and the second shielding curtain 4 include a stacked multilayer material, one layer of the stacked multilayer material is made of a material containing lead. For example, each shielding curtain may be represented as a single panel with an external contour, so as to improve a performance of shielding X-ray of the shielding curtain.

Figure 12:
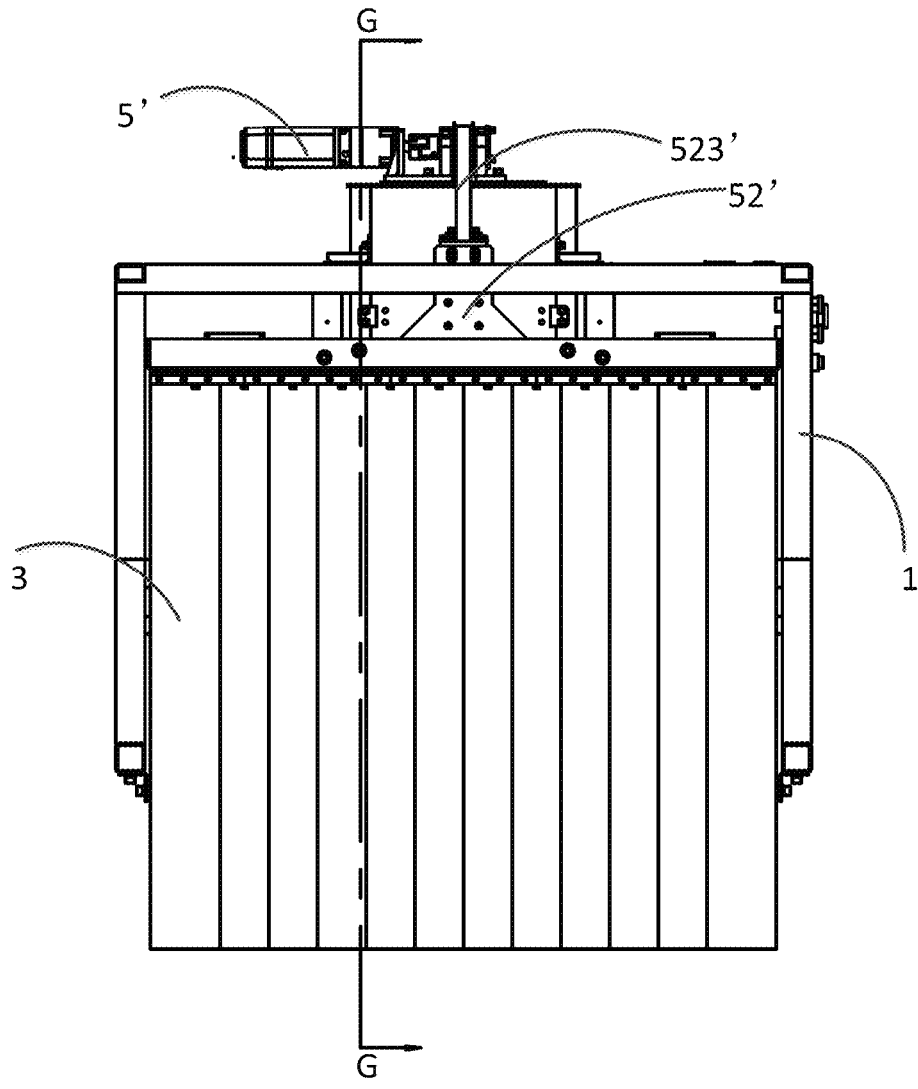
FIG. 12 shows a partial elevation view of a radiographic inspection device of another exemplary embodiment of the present disclosure.
Figure 13:
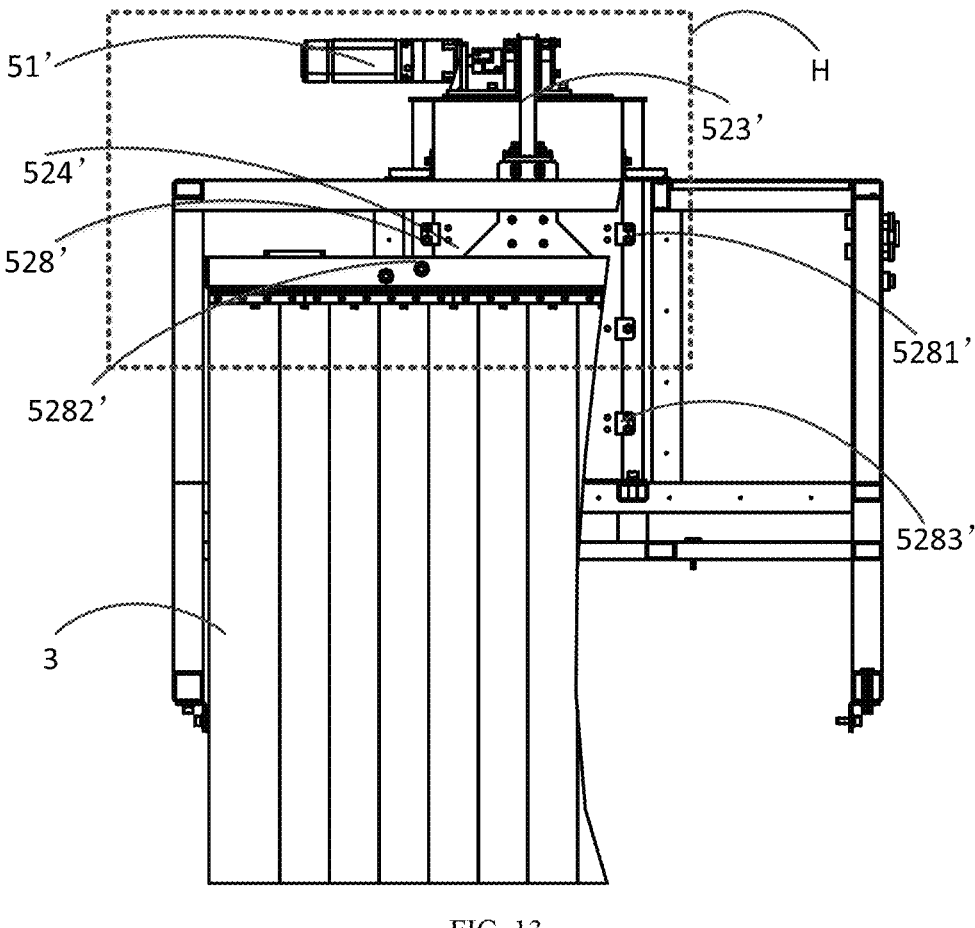
FIG. 13 shows a partial elevation view of a radiographic inspection device shown in FIG. 12, in which part of the shielding curtain is not shown.
Figure 14:
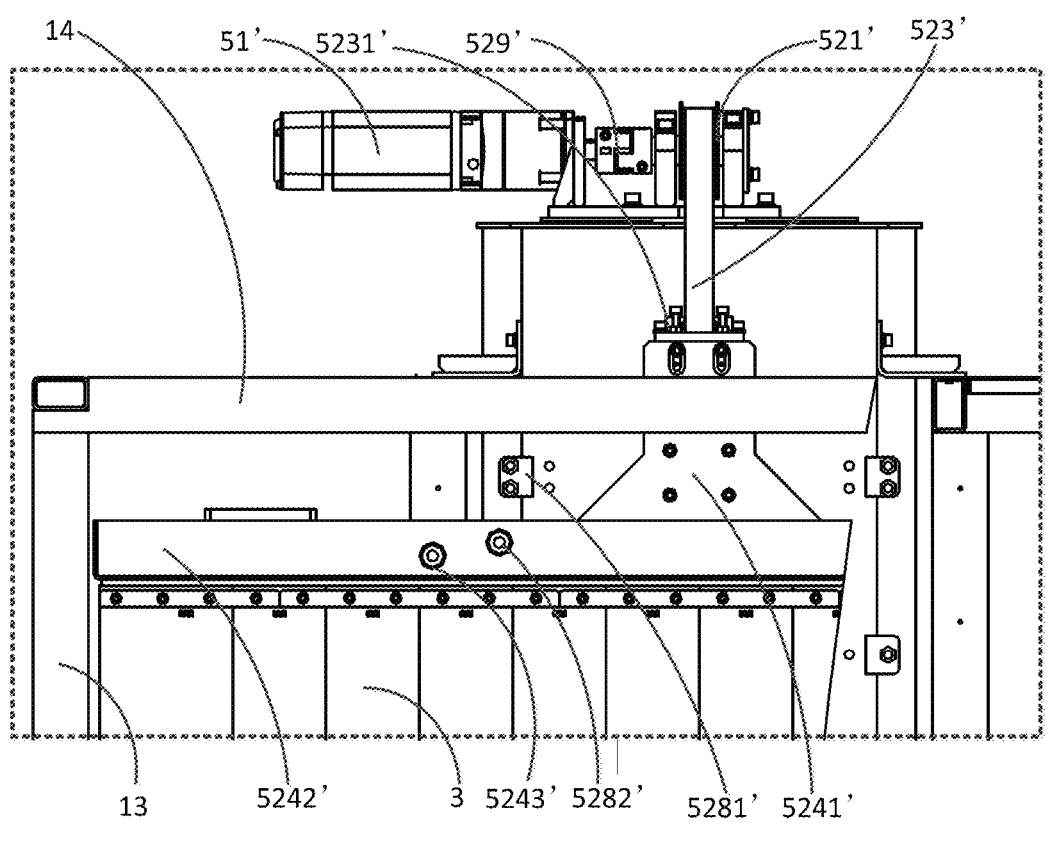
FIG. 14 shows an enlarged schematic diagram of part H shown in FIG. 13.
Figure 15:
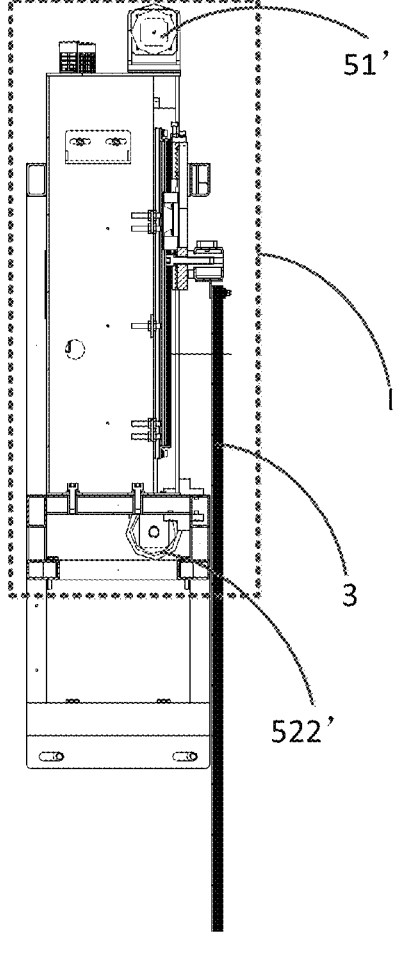
FIG. 15 shows a cross-sectional view along line G-G shown in FIG. 12.
Figure 16:
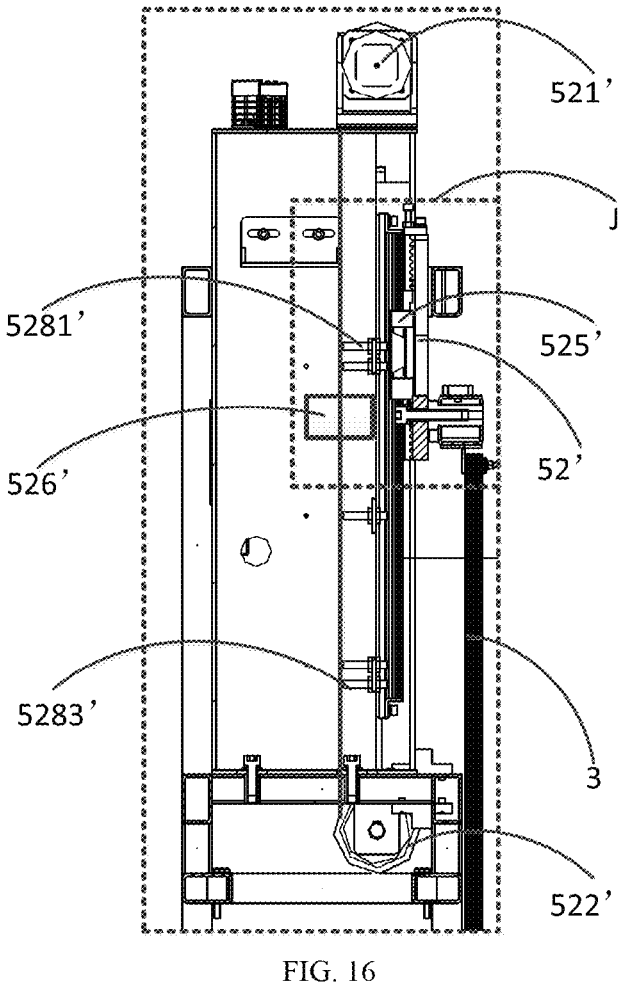
FIG. 16 shows an enlarged schematic diagram of part I shown in FIG. 15.
Figure 17:
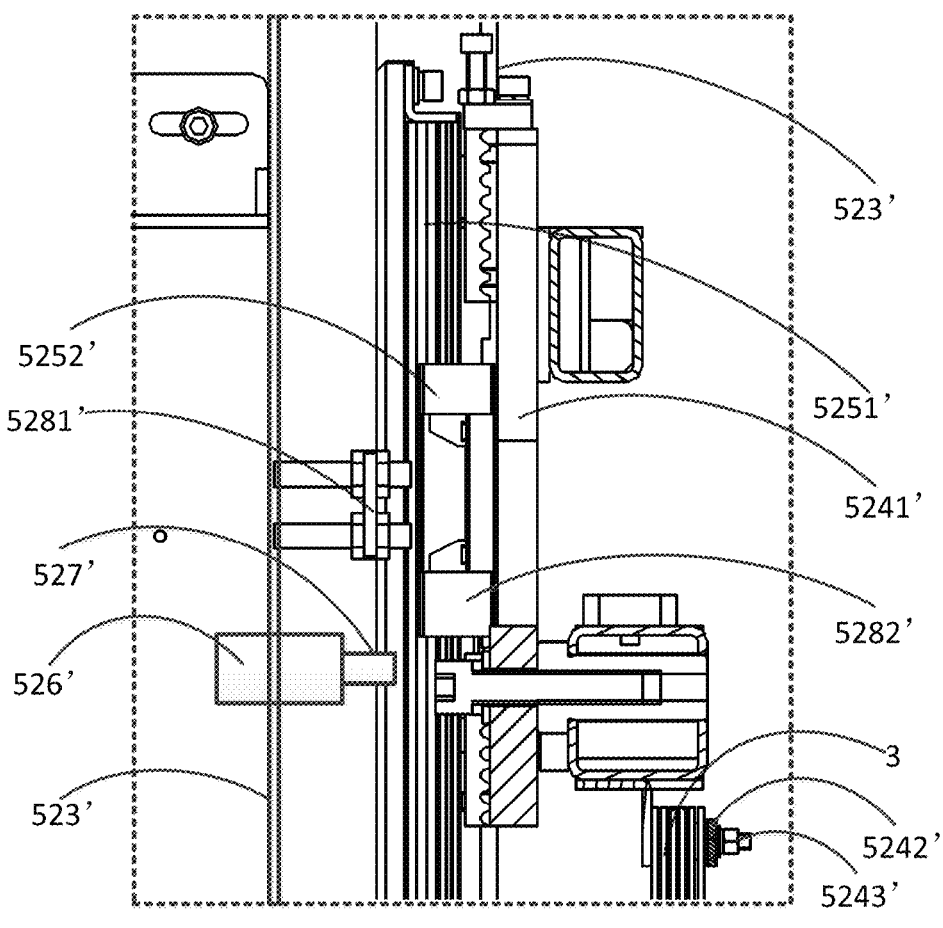
FIG. 17 shows an enlarged schematic diagram of part J shown in FIG. 15.

FIG. 12 shows a partial elevation view of a radiographic inspection device of another exemplary embodiment of the present disclosure. FIG. 13 shows a partial elevation view of a radiographic inspection device shown in FIG. 12, in which part of the shielding curtain is not shown. FIG. 14 shows an enlarged schematic diagram of part H shown in FIG. 13. FIG. 15 shows a cross-sectional view along line G-G shown in FIG. 12. FIG. 16 shows an enlarged schematic diagram of part I shown in FIG. 15. FIG. 17 shows an enlarged schematic diagram of part J shown in FIG. 15.

In an exemplary embodiment, with reference to FIGS. 1 to 2 and 12 to 17, each of the first driving mechanism and the second driving mechanism may include: a driver 51' mounted on the support frame 1 and a transmission mechanism 52'. The driver 51 drives the shielding curtain 3 to rise or fall through the transmission mechanism 52, so as to open or close a first entrance.

In an exemplary embodiment, with reference to FIGS. 1 to 2 and 12 to 17, the driver 51' includes a motor applicable to drive the transmission mechanism 52'. The transmission mechanism includes a first roller 521' mounted on an upper part of the support frame 1, and is driven to rotate by the motor through a coupling 529'; a second roller 522' mounted on the support frame 1 and located below the first roller 521'; a conveyor belt 523' wrapped around the first roller 521' and the second roller 522'; and a joint portion 524', where the shielding curtain 3 is connected to the conveyor belt 523' through the joint portion 524', so that the shielding curtain 3 is driven to move up and down with the conveyor belt 523'.

In an exemplary embodiment, with reference to FIGS. 12 to 17, the joint portion 524' includes a main body portion 5241', where the main body portion 5241' is connected to the conveyor belt 523'; a pair of clamping elements 5242', where the pair of clamping elements 5242' uses bolts 5243' to grip an upper end of the shielding curtain and are connected to the main body portion 5241'. In this way, the driver 51' drives the first roller 521' to rotate, so as to further drive the conveyor belt 523' to move up and down, thereby driving the upper end of the shielding curtain 3 and the entire shielding curtain 3 to move up and down.

Although an embodiment of the transmission mechanism including the first roller, the second roller and the conveyor belt are described above, the present disclosure is not limited to this. In an alternative embodiment, the transmission mechanism may include a turbine driven by a motor and a worm which matches with the turbine. The joint portion is mounted on the worm. In this way, the motor drives the turbine to rotate, and through a meshing between the turbine and the worm, a rotation of the motor is converted into a linear movement of the worm, thereby causing the worm to drive the shielding curtain to rise and fall. In another alternative embodiment, a piston rod of a pneumatic cylinder or a hydraulic cylinder may be used to drive the joint portion to reciprocate straight up and down, thereby driving the shielding curtain to rise and fall.

In an exemplary embodiment, the main body portion 5241' has an approximate shape of isosceles triangle or isosceles trapezoid. A narrower upper part of the main body portion is connected to the conveyor belt 523' through an elastic bolt mechanism 5231'. A wider lower part of the main body portion is connected to an approximate middle part of the pair of clamping elements 5242'. In this way, the conveyor belt 523' is used to drive the shielding curtain 3 to move, and the shielding curtain 3 may be maintain to move up and down in a stable posture.

In an exemplary embodiment, the transmission mechanism 52' also includes a first guide structure 525', where the first guide structure is applicable to guide the joint portion 524 to move up and down. In an exemplary embodiment, the first guide structure 525' includes: a guide rail 5251' mounted on the support frame 1; and a guide block 5252' mounted on the joint portion 524'. For example, a guide groove extending in the up and down direction may be formed on the guide rail 5251', and a part of the guide block 5252' may be inserted into the guide groove. In this way, the joint portion 524' and the shielding curtain 3 may move in a straight line in the up and down direction, so as to prevent the shielding curtain 3 from twisting. In an alternative embodiment, the first guide structure includes a guide groove formed in an inner side of a pair of upright frames 13 of the support frame 1 and extending up and down. Two ends of the clamping elements 5242' are inserted into the guide groove, so as to guide a lifting operation of the shielding curtain.

In an exemplary embodiment, the transmission mechanism 52' also includes a counterweight 526'. A weight of the counterweight 526' depends on a total weight of the joint portion 524 and the shielding curtain 3. The counterweight 526' is connected to the other side of the conveyor belt 523' opposite to one side connecting to the joint portion 524', so as to balance a weight of the joint portion 524' and a weight of the shielding curtain 3. By disposing the counterweight 526', a force driving a movement of the shielding curtain may be reduced, thereby reducing a power of the driver.

In an exemplary embodiment, the transmission mechanism 52' also includes a second guide structure 527', where the second guide structure 527' is applicable to guide the counterweight 526' to move up and down. In an exemplary embodiment, the second guide structure 527' includes: a guide rail mounted on the support frame 1; and a guide block mounted on a configuration 4. In this way, the configuration 526' may move in a straight line in the up and down direction.

In an exemplary embodiment, with reference to FIGS. 12 to 17, the radiographic inspection device 100 also includes a limiting apparatus 528'. The limiting apparatus 528' is applicable to limit a range of movement of the joint portion 524' in an up and down direction, thereby limiting a lifting range of the shielding curtain. Specifically, the limiting apparatus 528' includes a first proximity switch 5281' mounted on the support frame 1; and a matching switch 5282' mounted on the joint portion 524'. The driving mechanism 5 stops driving the shielding curtain 3 to rise in response to the matching switch 5282' being close to the first proximity switch 5281'. Furthermore, the limiting apparatus 528' also includes a second proximity switch 5283' mounted on the support frame 1. The driving mechanism 5 stops driving the shielding curtain 3 to fall in response to the matching switch 5282' being close to the second proximity switch 5283'. That is to say, when the matching switch 5282' is close to the first proximity switch 5281', the shielding curtain 3 is stopped rising. When the matching switch 5282' is close to the second proximity switch 5283', the shielding curtain 3 is stopped falling. In this way, the range of movement of the upper end of shielding curtain 3 is limited to a distance between the first proximity switch 5281' and the second proximity switch 5283'. That is to say, a maximum lifting range of the shielding curtain 3 is the distance between the first proximity switch 5281' and the second proximity switch 5283'. In an exemplary embodiment, the first proximity switch 5281' and the second proximity switch 5283' are electromagnetically coupled with the matching switch 5282' through an inductive induction. For example, each of the first proximity switch 5281' and the second proximity switch 5283' includes a transmitting coil. The matching switch 4282' includes a receiving coil electromagnetically coupled with the transmitting coil. In an alternative embodiment, the first proximity switch 5281' and the second proximity switch 5283' are electrically connected to the mating switch 5282' through an electrical contact manner.

Although the embodiments of the first driving mechanism 53 driving the rising and falling of the first shielding curtain 3 at the entrance 111 are described above, those of ordinary skill in the art may understand that the second driving mechanism 54 with the same or similar structure may drive the rising and falling of the second shielding curtain 4 at the exit 112, and the driver and the transmission mechanism applicable to the first shielding curtain 3 may be the same or similar to the driver and transmission mechanism applicable to the second shielding curtain 4. In an alternative exemplary embodiment, one driver may selectively drive the first shielding curtain 3 and the second shielding curtain 4 through a clutch. That is to say, the first shielding curtain 3 and the second shielding curtain 4 share one common driving mechanism 5.

According to another embodiment of the present disclosure, a method of inspecting an object 200 using the radiographic inspection device 100 described in any of the above embodiments is provided, with reference to FIGS. 1 and 2, including the following steps.

An object 200 to be detected is placed on the input transfer mechanism 21 of the transfer mechanism, so that the transfer mechanism drives the object 200 to move in a movement direction F.

When the object 200 to be inspected moves close to the entrance 111, a first detection apparatus 7 is triggered, and the first shielding curtain 3 is driven to rise by the driving mechanism 5, so as to allow the object 200 on an input transfer mechanism 21 of the transfer mechanism 2 to move along the movement direction F to an internal transfer mechanism 22 in the inspection space 11.

When the object 200 on an internal transfer mechanism 22 of the transfer mechanism 2 moves in the support frame 1 away from the first shielding curtain 3, the second detection apparatus 8 is triggered, and the first shielding curtain 3 is driven to fall to an initial position by the driving mechanism 5, where the initial position is a position of which a lower end of the first shielding curtain 3 is in contact with the transfer mechanism 2.

A radioactive inspection is performed on the object 200 moving within the internal transfer mechanism 22 of the transfer mechanism 2 within the inspection space 11.

When the inspected object 200 in the inspection space 11 moves close to the exit 112, a third detection apparatus 9 is triggered, and the second shielding curtain 4 is driven to rise by the driving mechanism, so as to allow the object 200 on the internal transfer mechanism 22 of the transfer mechanism 2 to continue move along the moving direction F to an output transfer mechanism 23 outside the inspection space 11.

Furthermore, when the object on the output transfer mechanism 23 of the transfer mechanism 2 moves away from the second shielding curtain 4 outside the support frame 1, the fourth detection apparatus 10 is triggered, and the second shielding curtain 4 is driven to fall to the initial position by the driving mechanism, where the initial position is a position of which a lower end of the second shielding curtain 4 is in contact with the transfer mechanism 2.

According to the aforementioned embodiments of the present disclosure, the radiographic inspection device may drive the rising and falling of the shielding curtain by the driving mechanism based on an occurrence of the object getting close to or moving away from the shielding curtain. It is possible to ensure that lightweight objects may smoothly enter the inspection space for subsequent radiographic scanning. While inspecting the object, it is possible to achieve stricter shielding of X-rays in the inspection space, so as to ensure that the rays are not leaked into the surrounding environments. Furthermore, in order to achieve tighter shielding, even if the shielding curtain is made heavier with a good rigidity and includes a support plate with greater rigidity, it may avoid a case that the shielding curtain may not be opened by the object during the security inspection process, much less a possibility of leaking of X-rays. Due to the object entering the inspection space from the entrance and moving out of the inspection space from the exit, continuous inspection may be achieved.

It may be understood by those of ordinary skill in the art that the above-described embodiments are exemplary, and those of ordinary skill in the art may improve them. The structures described in various embodiments may be combined freely in terms of structures or principles not conflicting with each other.

Although the present disclosure has been described with reference to accompanying drawings, embodiments disclosed in the accompanying drawings are intended to illustrate optional embodiments of the present disclosure, and should not be construed as a limitation of the present disclosure. Although embodiments of the present disclosure have been illustrated and described, it may be understood by those of ordinary skill in the art that these embodiments may be changed without departing from the principle and spirit of the present disclosure. The scope of the present disclosure is defined by the appended claims and their equivalents.

What is claimed is:

1. A radiographic inspection device, comprising:
a support frame, wherein an inspection space applicable to inspect an object is formed within the support frame, and the inspection space has an entrance and an exit which are connecting to an outside;
a transfer channel applicable to carry the object to move through the inspection space;
a first shielding curtain and a second shielding curtain respectively mounted at the entrance and the exit; and
a driving mechanism mounted on the support frame and configured to drive at least one of the first shielding curtain and the second shielding curtain to move, in response to the object getting close to or moving away from at least one of the entrance and the exit, so as to open or close the at least one of the entrance or the exit,
wherein the driving mechanism comprises a first driving mechanism and a second driving mechanism applicable to respectively drive the first shielding curtain and the second shielding curtain to rise or fall,
wherein each of the first driving mechanism and the second driving mechanism comprises:
a driver mounted on the support frame; and
a transmission mechanism, wherein the driver drives the shielding curtain to rise or fall through the transmission mechanism,
wherein the driver comprises a motor,
the transmission mechanism comprises:
    a driven shaft mounted on an upper part of the support frame and driven to rotate by the motor;
    two first rollers respectively mounted near two ends of the driven shaft and configured to rotate with the driven shaft;
    two second rollers respectively mounted on two opposite upright frames of the support frame, and respectively located below the two first rollers;
    two conveyor belts each wrapped around one of the two first rollers and one of the two second rollers; and
    a joint portion, wherein two ends of the joint portion are respectively connected to the two conveyor belts, and the shielding curtain is connected to the joint portion, so that the shielding curtain is driven to move up and down with the conveyor belt,
wherein the radiographic inspection device further comprises a limiting apparatus, the limiting apparatus is applicable to limit a range of movement of the joint portion in an upright direction,
wherein the limiting apparatus comprises:
a first proximity switch mounted on the support frame; and
a matching switch mounted on the joint portion, wherein the driving mechanism stops driving the shielding curtain to rise in response to the matching switch being close to the first proximity switch; and
wherein the limiting apparatus comprises:
a second proximity switch mounted on the support frame, wherein the driving mechanism stops driving the shielding curtain to fall in response to the matching switch being close to the second proximity switch.

2. The radiographic inspection device of claim 1, further comprising a first detection apparatus, wherein the driving mechanism drives the first shielding curtain to rise, in response to the first detection apparatus detecting that the object carried on the transfer channel is located on an outer side of the support frame and is getting close to the first shielding curtain, so as to allow the object on the transfer channel to move into the inspection space.

3. The radiographic inspection device of claim 1, further comprising a second detection apparatus, wherein the driving mechanism drives the first shielding curtain to fall to an initial position, in response to the second detection apparatus detecting that the object carried on the transfer channel moves in the support frame away from the first shielding curtain.

4. The radiographic inspection device of claim 1, further comprising a third detection apparatus, wherein the driving mechanism drives the second shielding curtain to rise, in response to the third detection apparatus detecting that the object carried on the transfer mechanism is located in the support frame and is getting close to the second shielding curtain, so as to allow the object on the transfer mechanism to move outside the inspection space.

5. The radiographic inspection device of claim 1, further comprising a fourth detection apparatus, wherein the driving mechanism drives the second shielding curtain to fall to an initial position, in response to the fourth detection apparatus detecting that the object carried on the transfer mechanism moves outside the support frame away from the second shielding curtain.

6. The radiographic inspection device of claim 5, wherein a first detection apparatus, a second detection apparatus, a third detection apparatus and the fourth detection apparatus comprise: light emitting components and light receiving components respectively mounted on two sides of the support frame and perpendicular to a movement direction of the object, and the light receiving components are applicable to receive lights emitted by the light emitting components.

7. The radiographic inspection device of claim 1, wherein the joint portion comprises:
a main body portion having a shape of strip, wherein an upper end of the shielding curtain is connected to the main body portion; and
two guide mechanisms respectively disposed at two ends of the main body portion, wherein each guide mechanism is applicable to fit with the upright frame to guide the joint portion to move up and down along the upright frame.

8. The radiographic inspection device of claim 7, wherein each guide mechanism comprises:
a first pulley apparatus disposed at two ends of the main body portion and extending into a guide groove formed in the upright frame, so as to rotate by abutting against a side wall of the guide groove, wherein the guide groove extends in the upright direction on the upright frame; and
a second pulley apparatus mounted on a lower side of two ends of the main body portion, wherein pulleys of the second pulley apparatus are rotatably in contact with a bottom of the guide groove.

9. The radiographic inspection device of claim 7, wherein each guide mechanism comprises:
a sliding block disposed at two ends of the main body portion and slidably extending into a guide groove formed in the upright frame, wherein the guide groove extends in an-the upright direction on the upright frame.

10. The radiographic inspection device of claim 1, wherein the transmission mechanism further comprises a counterweight, wherein the counterweight is connected between the two conveyor belts, so as to balance a weight of the joint portion and a weight of the shielding curtain.

11. A method of inspecting an object using a radiographic inspection device, wherein the radiographic inspection device comprises: a support frame, wherein an inspection space applicable to inspect an object is formed within the support frame, and the inspection space has an entrance and an exit which are connecting to an outside; a transfer channel applicable to carry the object to move through the inspection space; a first shielding curtain and a second shielding curtain respectively mounted at the entrance and the exit; and a driving mechanism mounted on the support frame and configured to drive at least one of the first shielding curtain and the second shielding curtain to move, in response to the object getting close to or moving away from at least one of the entrance and the exit, so as to open or close the at least one of the entrance or the exit, wherein the driving mechanism comprises a first driving mechanism and a second driving mechanism applicable to respectively drive the first shielding curtain and the second shielding curtain to rise or fall, wherein each of the first driving mechanism and the second driving mechanism comprises: a driver mounted on the support frame; and a transmission mechanism, wherein the driver drives the shielding curtain to rise or fall through the transmission mechanism, wherein the driver comprises a motor, the transmission mechanism comprises: a driven shaft mounted on an upper part of the support frame and driven to rotate by the motor; two first rollers respectively mounted near two ends of the driven shaft and configured to rotate with the driven shaft; two second rollers respectively mounted on two opposite upright frames of the support frame, and respectively located below the two first rollers; two conveyor belts each wrapped around one of the two first rollers and one of the two second rollers; and a joint portion, wherein two ends of the joint portion are respectively connected to the two conveyor belts, and the shielding curtain is connected to the joint portion, so that the shielding curtain is driven to move up and down with the conveyor belt, wherein the radiographic inspection device further comprises a limiting apparatus, the limiting apparatus is applicable to limit a range of movement of the joint portion in an upright direction, wherein the limiting apparatus comprises: a first proximity switch mounted on the support frame; and a matching switch mounted on the joint portion, wherein the driving mechanism stops driving the shielding curtain to rise in response to the matching switch being close to the first proximity switch; and wherein the limiting apparatus comprises: a second proximity switch mounted on the support frame, wherein the driving mechanism stops driving the shielding curtain to fall in response to the matching switch being close to the second proximity switch, and the method comprises:

placing the object to be inspected on a transfer mechanism;

driving, when the object to be inspected moves close to the entrance, the first shielding curtain to rise by the driving mechanism, so as to allow the object on the transmission mechanism to move into the inspection space;

driving, when the object on the transmission mechanism moves in the support frame away from the first shielding curtain, the first shielding curtain to fall to an initial position by the driving mechanism;

performing a radioactive inspection on the object moving within the inspection space; and driving, when the inspected object in the inspection space moves close to the exit, the second shielding curtain to rise by the driving mechanism, so as to allow the object to move outside the inspection space.

12. A radiographic inspection device, comprising:

a support frame, wherein an inspection space applicable to inspect an object is formed within the support frame, and the inspection space has an entrance and an exit which are connecting to an outside;

a transfer channel applicable to carry the object to move through the inspection space;

a first shielding curtain and a second shielding curtain respectively mounted at the entrance and the exit; and a driving mechanism mounted on the support frame and configured to drive at least one of the first shielding curtain and the second shielding curtain to move, in response to the object getting close to or moving away from at least one of the entrance and the exit, so as to open or close the at least one of the entrance or the exit, wherein the driving mechanism comprises a first driving mechanism and a second driving mechanism applicable to respectively drive the first shielding curtain and the second shielding curtain to rise or fall, wherein each of the first driving mechanism and the second driving mechanism comprises:

a driver mounted on the support frame; and a transmission mechanism, wherein the driver drives the shielding curtain to rise or fall through the transmission mechanism, wherein the driver comprises a motor, the transmission mechanism comprises:

a first roller mounted on an upper part of the support frame and driven to rotate by the motor;

a second roller mounted on the support frame and located below the first roller;

a conveyor belt wrapped around the first roller and the second roller; and a joint portion, wherein the shielding curtain is connected to the conveyor belt through the joint portion, so that the shielding curtain is driven to move up and down with the conveyor belt, wherein the transmission mechanism further comprises a limiting apparatus, wherein the limiting apparatus is applicable to limit a range of movement of the joint portion in an up and down direction, wherein the limiting apparatus comprises:

a first proximity switch mounted on the support frame; and a matching switch mounted on the joint portion, wherein the driving mechanism stops driving the shielding curtain to rise in response to the matching switch being close to the first proximity switch; and a second proximity switch mounted on the support frame, wherein the driving mechanism stops driving the shielding curtain to fall in response to the matching switch being close to the second proximity switch.

13. The radiographic inspection device of claim 12, wherein the joint portion comprises:

a main body portion connected to the conveyor belt;

a pair of clamping elements, wherein the pair of clamping elements grip an upper end of the shielding curtain and are connected to the main body portion.

14. The radiographic inspection device of claim 12, wherein the transmission mechanism further comprises a first guide structure, wherein the first guide structure is applicable to guide the joint portion to move up and down, a guide rail mounted on the support frame; and a guide block mounted on the joint portion.

15. The radiographic inspection device of claim 12, wherein the transmission mechanism further comprises a counterweight, wherein the counterweight is connected to the other side of the conveyor belt opposite to one side connecting to the joint portion, so as to balance a weight of the joint portion and a weight of the shielding curtain, wherein the transmission mechanism further comprises a second guide structure, wherein the second guide structure is applicable to guide the counterweight to move up and down.

\*  \*  \*  \*  \*